United States Patent
Okamura

[11] Patent Number: 6,111,320
[45] Date of Patent: Aug. 29, 2000

[54] SEMICONDUCTOR DEVICE HAVING A BARRIER FILM FOR PREVENTING PENETRATION OF MOISTURE

[75] Inventor: Ryuichi Okamura, Tokyo, Japan

[73] Assignee: NEC Corporation, Tokyo, Japan

[21] Appl. No.: 09/045,875

[22] Filed: Mar. 23, 1998

[30] Foreign Application Priority Data

Mar. 24, 1997 [JP] Japan ................................ 9-069888

[51] Int. Cl.$^7$ ..................................... H01L 23/48
[52] U.S. Cl. ........................... 257/760; 257/773; 257/774
[58] Field of Search ..................... 257/773, 760

[56] References Cited

U.S. PATENT DOCUMENTS 5,210,054  5/1993  Ikeda et al. ............................... 437/195

FOREIGN PATENT DOCUMENTS

| 60-202943 | 10/1985 | Japan | H01L 21/314 |
| 1-212451 | 8/1989 | Japan | H01L 21/90 |
| 4-170052 | 6/1992 | Japan | H01L 21/90 |
| 6-291197 | 10/1994 | Japan | H01L 21/90 |

OTHER PUBLICATIONS

M. Noyori et al., "Secondary Slow Trapping—A New Moisture Induced Stability Phenomenon In Scaled CMOS Devices", *20th Annual Proceedings International Reliability Physics Symposium*, 1982, pp. 113–121.

*Primary Examiner*—Tom Thomas
*Assistant Examiner*—Ori Nadav
*Attorney, Agent, or Firm*—Sughrue, Mion, Zinn, Macpeak & Seas, PLLC

[57] ABSTRACT

By assuming a symbol A for the contact depth, B for the diameter of the contact, C for the thickness of the underlay oxide to be formed between the barrier film and the semiconductor substrate, and D for the eave protrusion length of the barrier film the eaves being formed inside the contact when oxide wet etching is performed for removing natural oxide on the silicon and for reducing the contact resistance, the following relation is established, $$\tan^{-1}(B/A) < \tan^{-1}((B-D)/(A-C)).$$

A barrier film for checking penetration of the moisture from the outside may be composed of a nitride film, or the barrier film for checking penetration of the moisture from the outside may be composed of a film formed through nitrogen ion implanting applied on the surface of the underlay oxide.

3 Claims, 11 Drawing Sheets

41 BASE INTERLAYER FILM
31 NITRIDE FILM
21 UNDERLAY OXIDE
11 SILICON SUBSTRATE

51 CONTACT
41 BASE INTERLAYER FILM
31 NITRIDE FILM
21 UNDERLAY OXIDE
11 SILICON SUBSTRATE

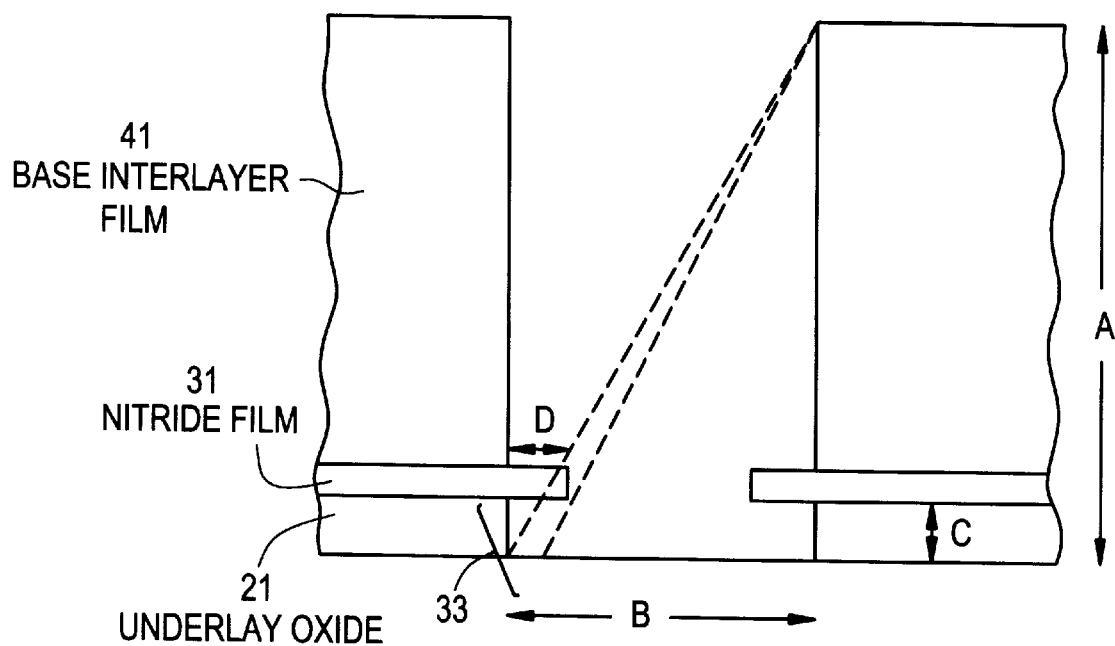

SEMICONDUCTOR DEVICE HAVING A BARRIER FILM FOR PREVENTING PENETRATION OF MOISTURE

BACKGROUND OF THE INVENTION

1. Field of the Invention

The present invention relates to a semiconductor device, more particularly to a semiconductor device having a barrier film for preventing penetration of moisture from the outside.

2. Description of the Related Art

In the microscopic MOS transistor field of the present day, a secondary slow trapping phenomenon has become a problem. (In the following description, a slow trapping means a secondary slow trapping. Refer to a bibliography "N. Noyori et al: Secondary slow trapping—A new moisture induced instability phenomenon in scaled CMOS devices, 20th Ann. Proc. International Reliability Physics Symposium, pp. 113–121, 1982.").

Slow trapping means a phenomenon in which a characteristic such as $V_t$ of a transistor undergoes a time elapse change caused by moisture contained in interlayer insulation films. As a countermeasure therefor, a film such as a nitride film having a good moisture-proof property is formed as a barrier to prevent penetration of moisture from the outside to avoid generation of slow trapping.

A prior technique will be described with reference to FIG. 1 and FIGS. 2(a), 2(b).

When a barrier film such as a nitride film is formed, for example, if nitride film 31 is formed after wiring process is finished as shown in FIG. 1, incidentally other interlayer insulation films (41, 82, 92, 102, 112 in FIG. 1) made of such as oxide films are thickly provided between silicon substrate 11 and nitride film 31, thereby producing slow trapping caused by moisture included in the interlayer insulation films. Although four layer wiring is shown in FIG. 1, more multilayered wiring will be required as miniaturization and high integration of the wiring proceeds in future, and hence forming the barrier film after finishing the wiring process becomes meaningless as a countermeasure for preventing slow trapping.

If nitride film 31 is formed after forming a transistor as shown in FIG. 2(a), there exists no other interlayer insulation film between silicon substrate 11 and nitride film 31, however in this case, since nitride film 31 is formed directly on silicon substrate 11 in a region of a source•drain diffusion layer, there occurs a problem such that an increased leak current flows due to a stress produced at the time of forming the nitride film or due to a level generated on a silicon interface.

Therefore, as shown in FIG. 2(b), such a method is now applied which includes the steps of forming underlay oxide 21 for stress relief after forming a transistor, and then forming nitride film 31 thereon. In place of forming nitride film 31, there is another method for forming an underlay oxide, and then applying nitrogen ion implantation thereon to nitrify an oxide surface as a barrier film.

Next, the prior technique will be described with reference to FIG. 3–FIG. 7.

As shown in FIG. 3(a), underlay oxide 21 is first formed for stress relief on silicon substrate 11 which has a semiconductor element formed thereon. Although the required thickness of underlay oxide 21 varies depending upon the thickness of a nitride film to be formed thereon, the thickness of underlay oxide 21 is enough for fulfilling a role of stress relieving, if it is in a range of 100 to 500 Å. Further on underlay oxide 21, nitride film 31 of 50 to 500 Å thick is formed as a barrier film for checking the penetration of moisture. There is another method comprising the steps of, instead of forming nitride film 31, first forming an underlay oxide, and then performing nitrogen ion implantation to nitrify the oxide surface for making it the barrier film.

Then, base interlayer film 41 for flattening the base is formed in a thickness in the range of 8,000 to 15,000 Å.

Then, opening contact 51 is provided as shown in FIG. 3(b), and in order to set up an ohmic junction for the contact, an N type dopant and a P type dopant both of high density are injected to the contact on an N type diffusion layer and to the contact on a P type diffusion layer, respectively. However in this case, injection of the dopant immediately after forming the opening contact sometimes induces a lattice defect appearing on the silicon surface, thereby causing trouble such as a leak.

Therefore, as shown in FIG. 4(a), the above high density contact injection is performed after forming protection film 61 of silicon substrate 11. In this case, protection film 61 is formed to 100 to 300 Å thick with such as a plasma CVD oxide. However, since the plasma CVD oxide has poor coverage, the film thickness becomes thin in the contact side wall, and the oxide is hardly formed particularly at the side wall near the bottom of the contact.

Next, as shown in FIG. 4(b), protection film 61 is removed by anisotropic etching.

Then, in order to lower the contact resistance by removing the natural oxide on the silicon, wet etching is applied to the oxide as shown in FIG. 5(a). As for oxide wet etching, it is performed for about 30 seconds with an etching liquid prepared by adding $NH_4F$ as a buffer to a solution of $H_2O:HF=30:1$ (hereinafter this etching liquid is described as 130 BHF). At this time, since almost no protection film 61 exists on the side wall of the contact bottom, the side wall of the contact is etched, but nitride film 31 is not etched and hence eaves 32 of the nitride film is formed inside contact 51. With the above etching time, the protrusion length of eaves 32 of the nitride film is about 300 Å.

Next, as shown in FIG. 5(b), although barrier metal 71 is formed by spattering to prevent the reaction between the wiring metal or the contact filling metal and the silicon substrate, no barrier film is formed at this time by sputtering on the under part of aforementioned nitride film eaves 32.

FIG. 6 is a typical view showing an inside state of the contact before barrier metal is sputtered. In other words, when the contact depth is A, the contact diameter B, the underlay oxide thickness C, and the protrusion length of the nitride film eaves D, it is understood that the following inequality is established.

$$\tan^{-1}(B/A) > \tan^{-1}((B-D)/(A-C))$$

For example, when it is assumed that the contact depth A=8550 Å, the contact diameter B=5000 Å, the underlay oxide thickness C=500 Å, the protrusion length of the nitride film eaves D=300 Å, the following data are obtained satisfying the above inequality.

$$\tan^{-1}(B/A)=0.5292$$

$$\tan^{-1}((B-D)/(A-C))=0.5285$$

When miniaturization further advances and the contact size is more miniaturized in future, this tendency will further be increased.

In the conventional example which satisfies the above relational formula, eaves shade 33 formed by nitride film eaves 32 is also produced on the silicon substrate of the contact bottom as shown in FIG. 5(b), and barrier metal 71 is not sputtered on this portion thus leaving silicon substrate 11 as it is exposed.

After then, first layer wiring 81 metal is formed as shown in FIG. 7(a), or filling metal 52 for filling up the inside of the contact is formed as shown in FIG. 7(b). At this time, since nitride film eaves shade 33 portion on silicon substrate 11 on the contact bottom has no barrier film 71 formed thereon while having the silicon remained as it is exposed, the first layer wiring 81 metal or contact filling metal 52 and silicon substrate 11 react upon each other in the following heat treatment process or the like. For example, if the first layer wiring 81 metal is aluminum or aluminum alloy, the silicon and the aluminum react to generate an alloy spike thereby causing a leak. Also for forming filling metal 52, the gaseous phase reaction is utilized using $WF_4$ gas to form tungsten W. However in this case, silicon and fluorine F react upon each other at the area having no barrier film, and accordingly hollow disfigurement 34 is produced on the silicon substrate at the bottom of the contact thereby inducing a cause of a leak or the like.

An example of means for eliminating the nitride film eaves which causes the above trouble is disclosed in J. P. A. Gazette 208367/1991. The nitride film of this example is formed as a dielectric film of a polysilicon capacitor, and as shown in this example, if only the nitride film of the necessary part is left and other nitride film in the contact opening is removed, no nitride film eaves is produced. However, this method has several problems and is not practical because it requires the complex processes of the increased number and when the nitride film is used as a moisture barrier film and if the nitride film removed area becomes large, it can no more function as the barrier film.

Namely, the prior technique described above has the following problems.

Since the nitride film eaves shade portion is produced on the silicon substrate, no barrier metal is spattered on the nitride film eaves shade portion inside the contact and the silicon substrate is left as it is exposed to directly contact with the wiring metal or the contact filling metal, thereby producing defects which become the cause of the leak or the like deteriorating the reliability of the device.

SUMMARY OF THE INVENTION

An object of the present invention is to provide a semiconductor device having a barrier film for preventing penetration of moisture from the outside, and can prevent the silicon substrate from being exposed due to the barrier film eaves produced inside the contact, thereby successfully avoiding the deterioration of reliability.

The semiconductor device of the present invention having a barrier film for preventing the penetration of moisture from the outside, has the following relation when it is assumed that the contact depth is A, the contact diameter B, the underlay oxide thickness to be formed between the barrier film and the silicon substrate C, and the barrier film eaves protrusion length D which is formed inside the contact when oxide wet etching is performed for removing a natural oxide on the silicon substrate and for reducing the contact resistance, $$\tan^{-1}(B/A) < \tan^{-1}((B-D)/(A-C)).$$

Further, the barrier film preventing penetration of moisture from the outside can be made of the nitride film.

Further, the barrier film preventing penetration of moisture from the outside can be made of a film formed by performing the nitrogen ion implantation on the surface of the underlay oxide.

Therefore, by having the above relation, it becomes possible to prevent the state that the silicon substrate of the contact bottom is exposed being caused by the barrier film eaves shade at the time when the barrier metal is sputtered.

BRIEF DESCRIPTION OF THE DRAWING

FIG. 6 is a typical view showing a structural characteristic of the prior example.

DETAILED DESCRIPTION OF THE PREFERRED EMBODIMENTS

Next, an embodiment of the present invention will be described with reference to the drawings.

Figure 1:
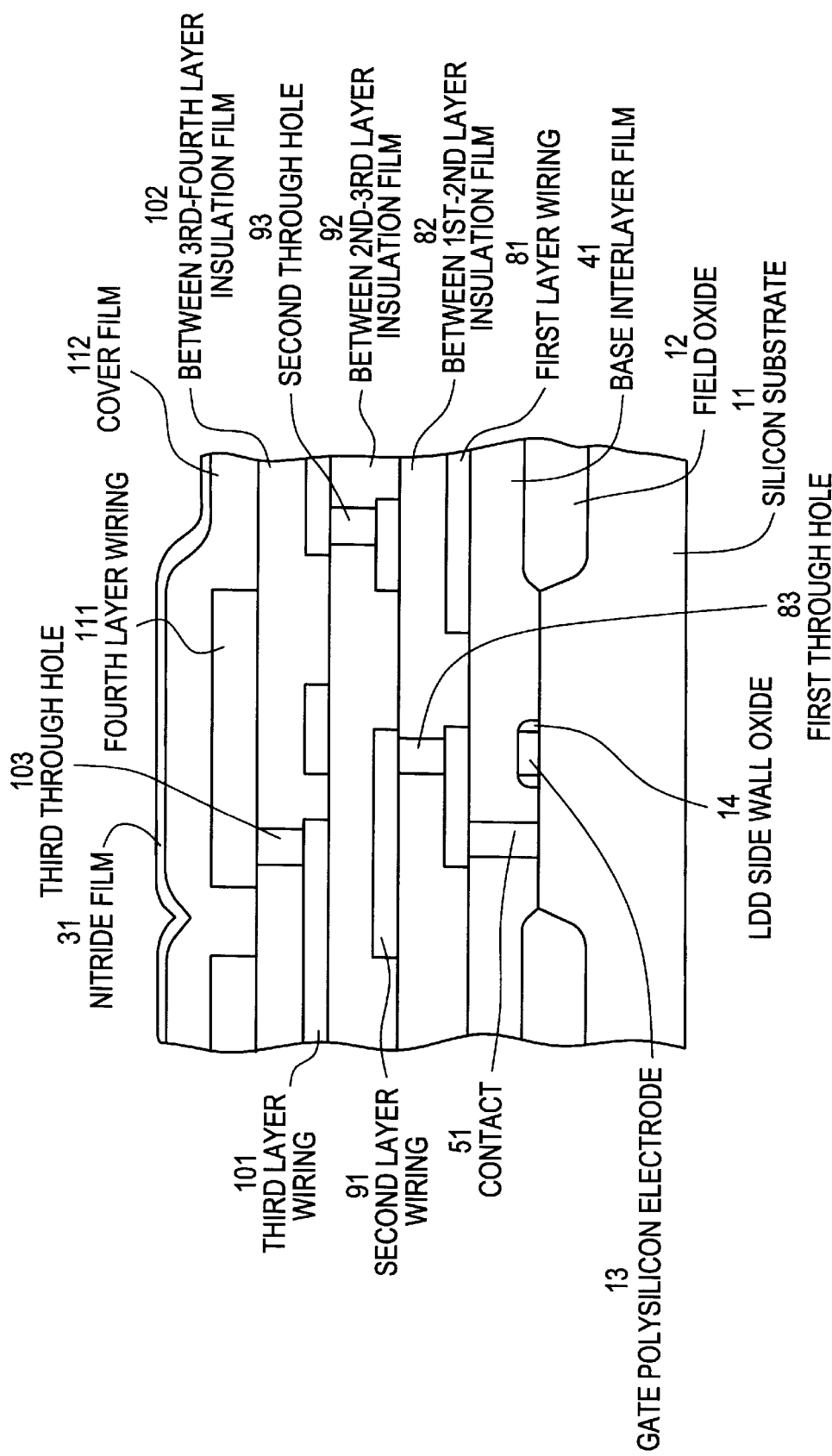
FIG. 1 is a sectional view for explaining problems included in various structures of a prior technique to be employed when a barrier film is formed for preventing penetration of moisture from the outside.
Figure 2A:
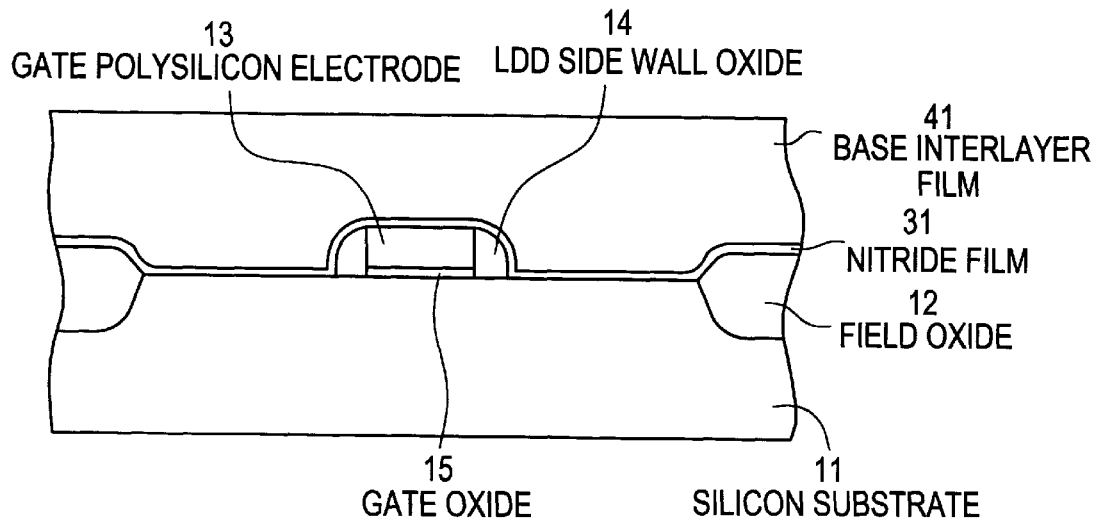
FIGS. 2(a) to 2(b) each shows a sectional view for explaining problems included in various structures of the prior technique to be employed when the barrier film is formed for preventing penetration of moisture from the outside.
Figure 2B:
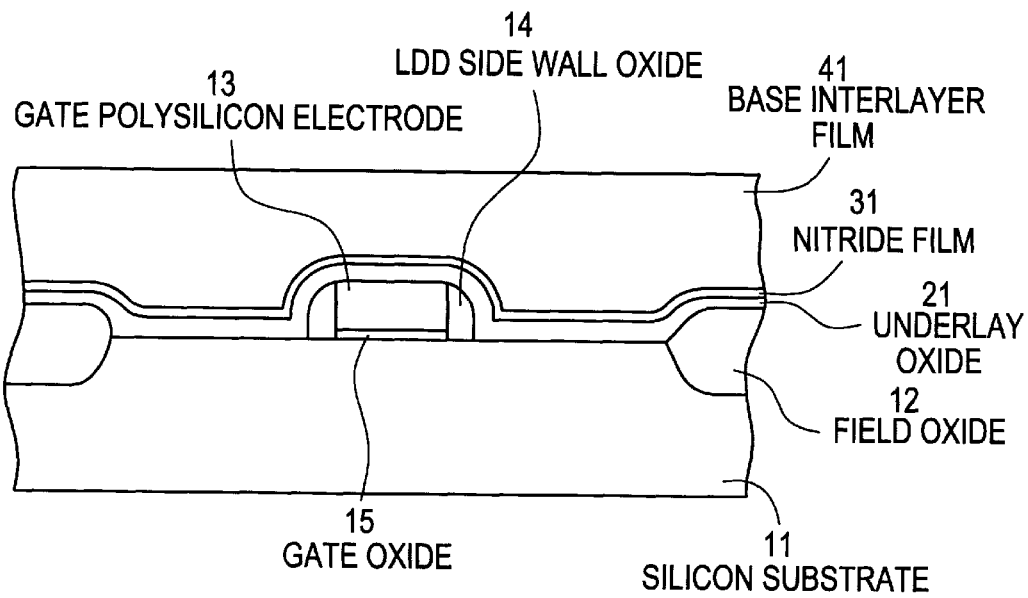
Figure 3A:
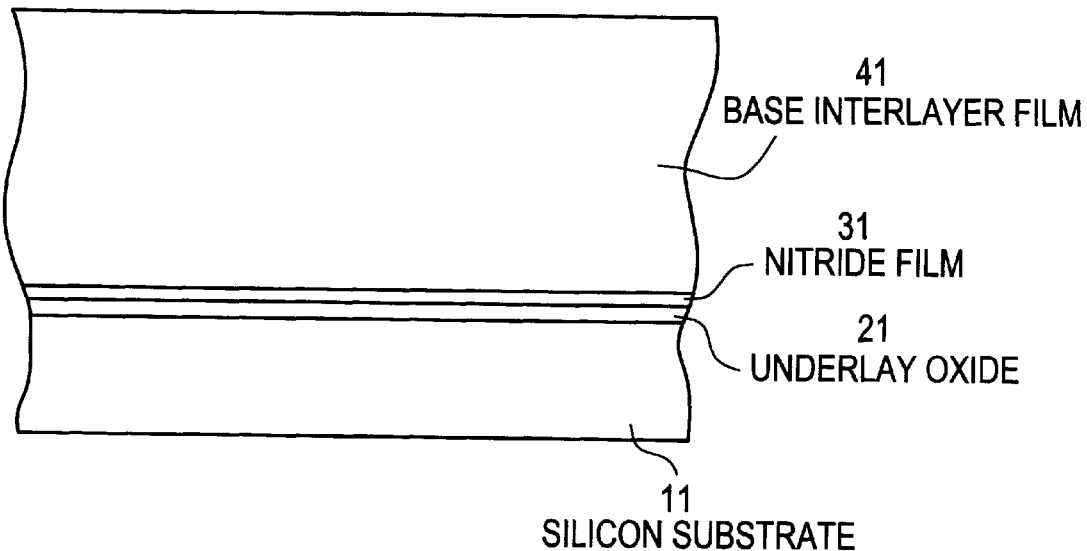
FIGS. 3(a) to 3(b) are sectional views of a prior example shown in the order of a manufacturing process, respectively.
Figure 3B:
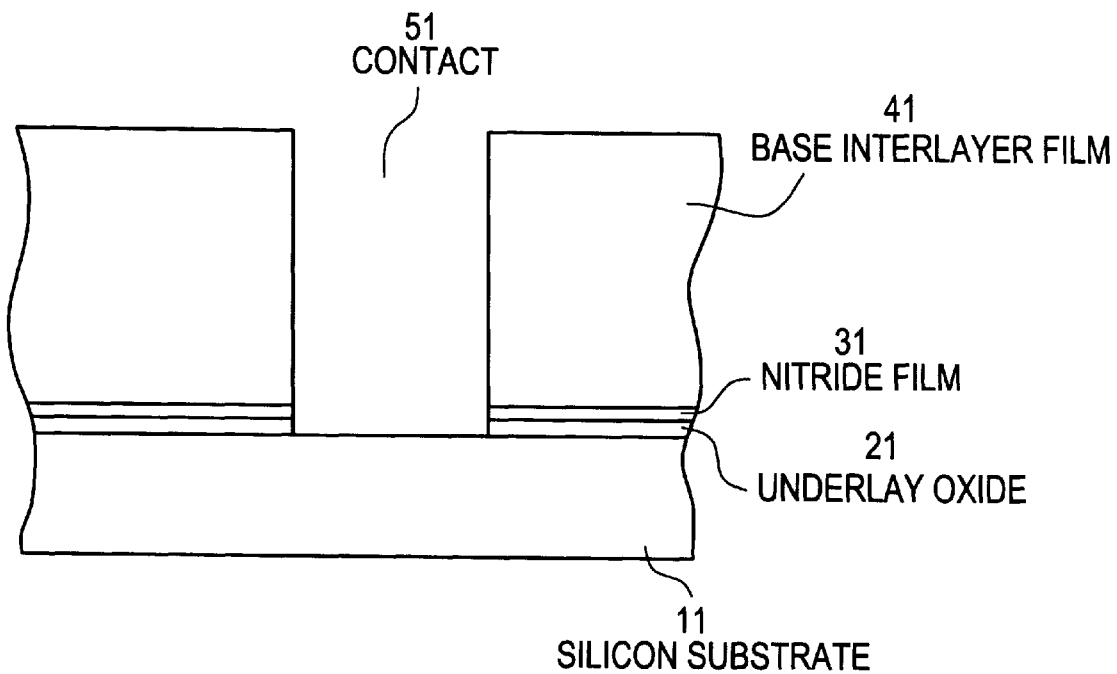
Figure 4A:
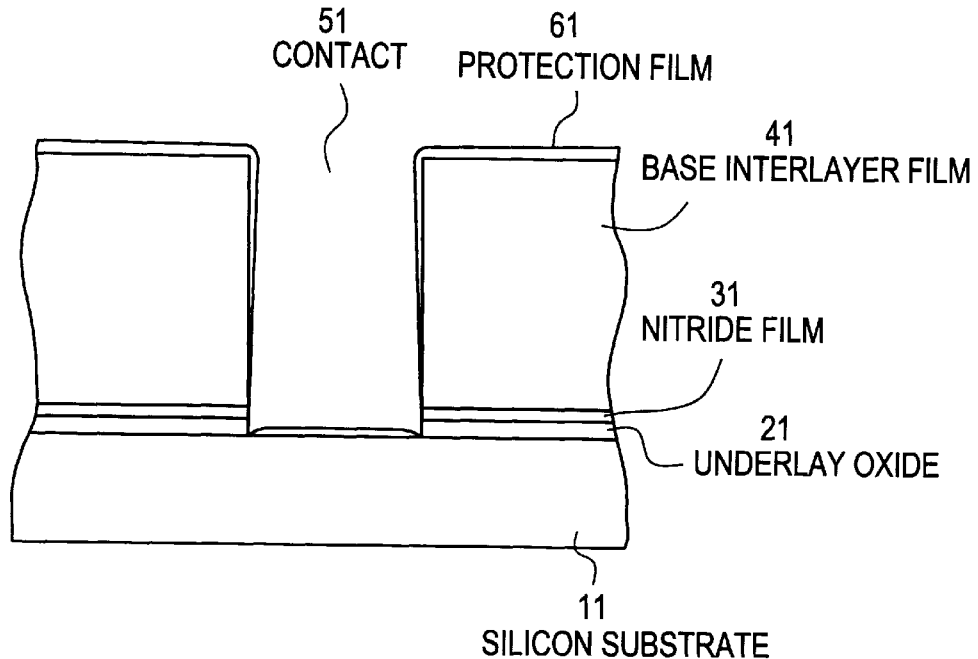
FIGS. 4(a) to 4(b) are sectional views of the prior example shown in the order of the manufacturing process, respectively.
Figure 4B:
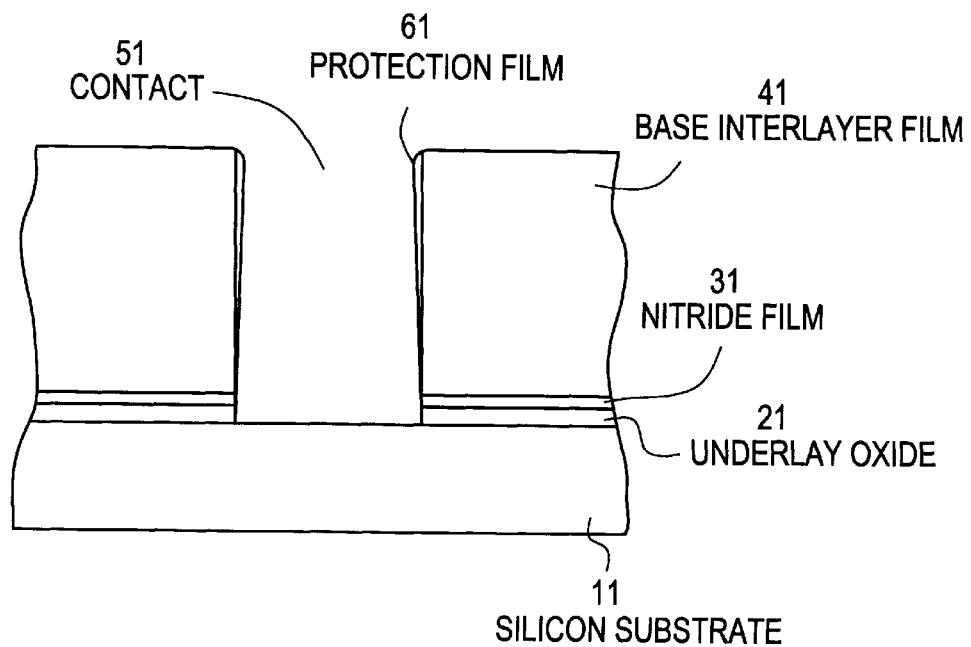
Figure 5A:
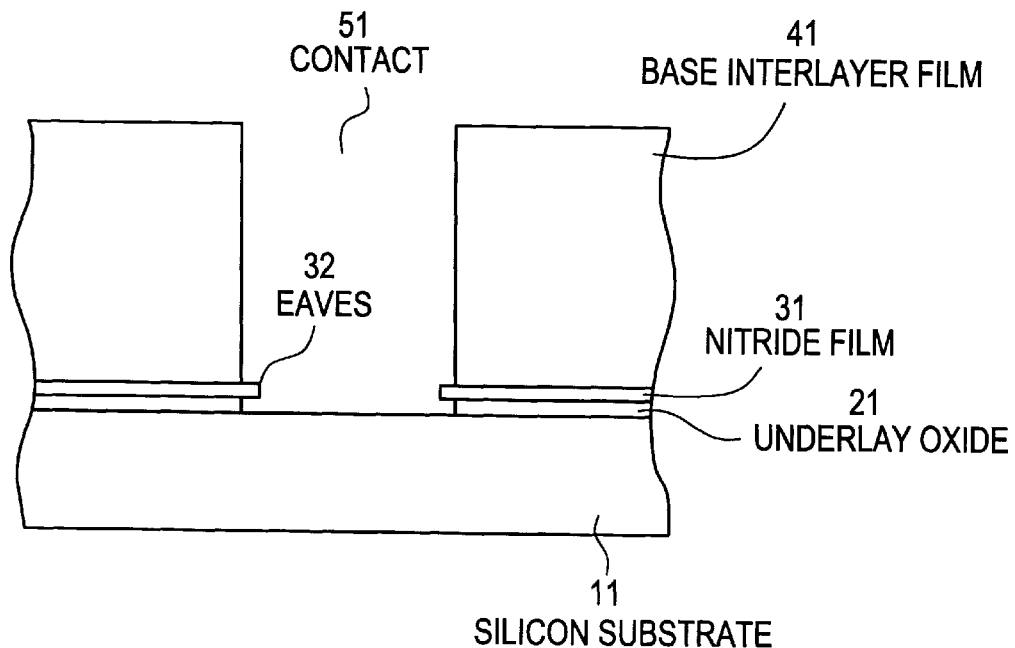
FIGS. 5(a) to 5(b) are sectional views of the prior example shown in the order of the manufacturing process, respectively.
Figure 5B:
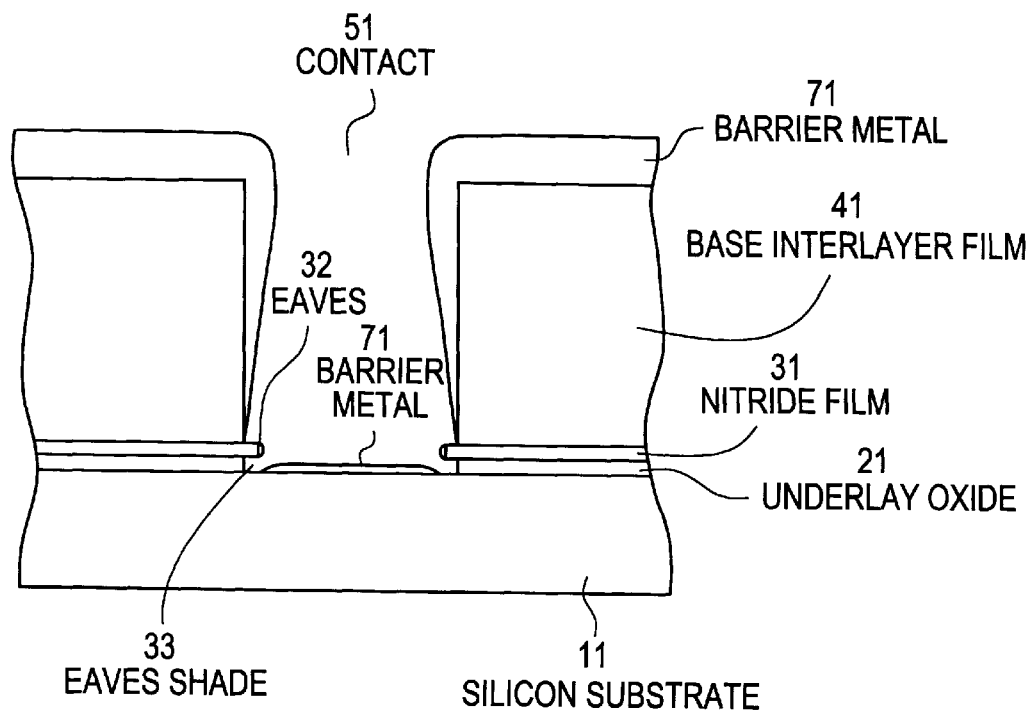
Figure 7A:
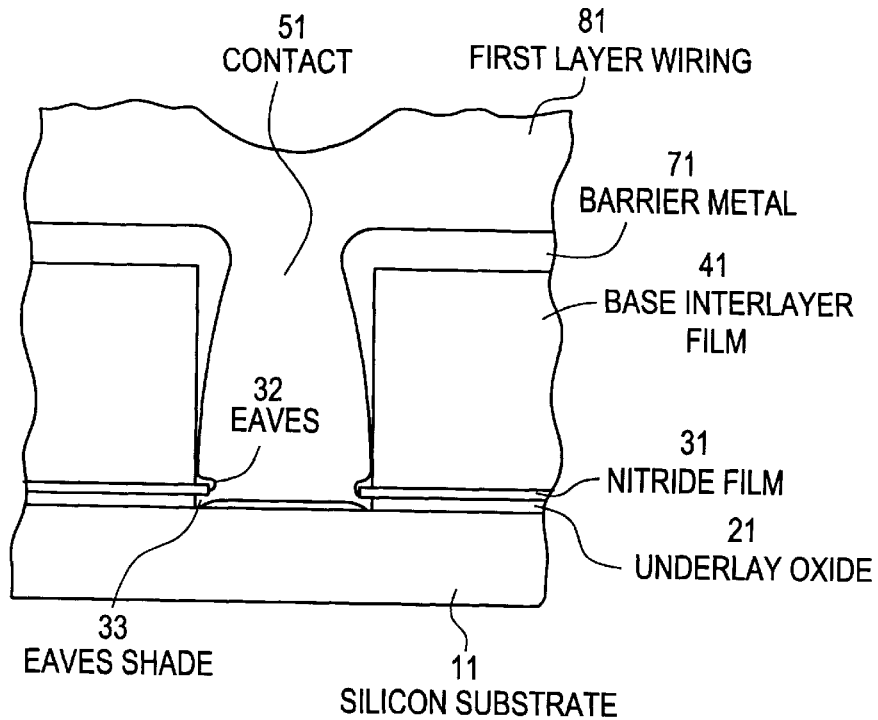
FIGS. 7(a) to 7(b) are sectional views showing problems in the prior example, respectively.
Figure 7B:
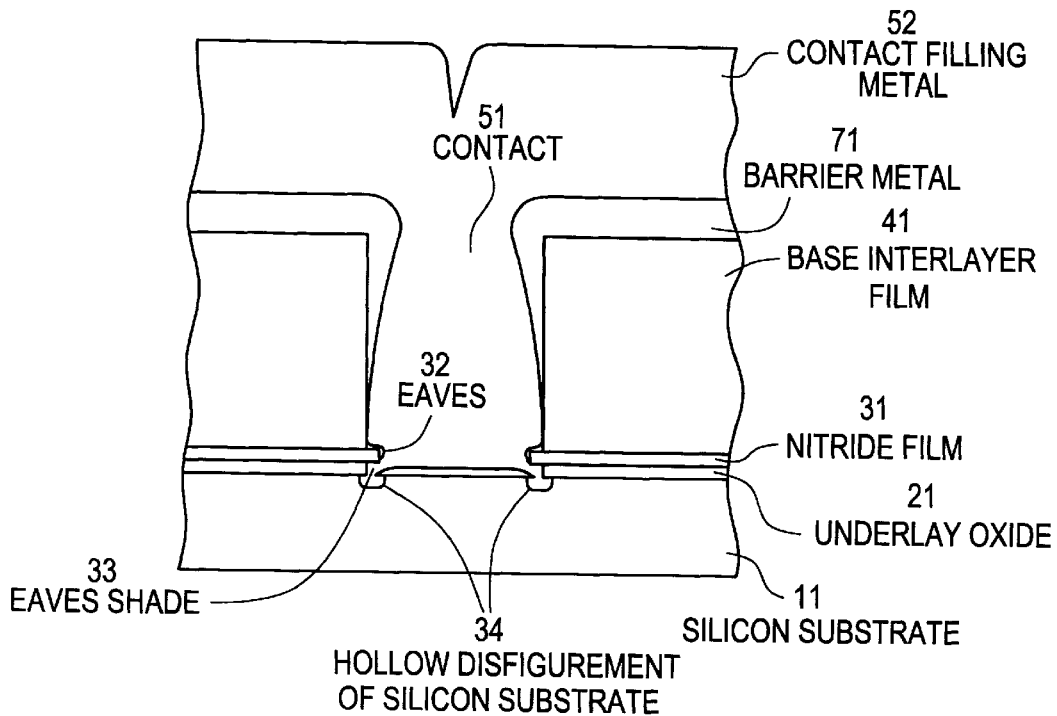
Figure 8A:
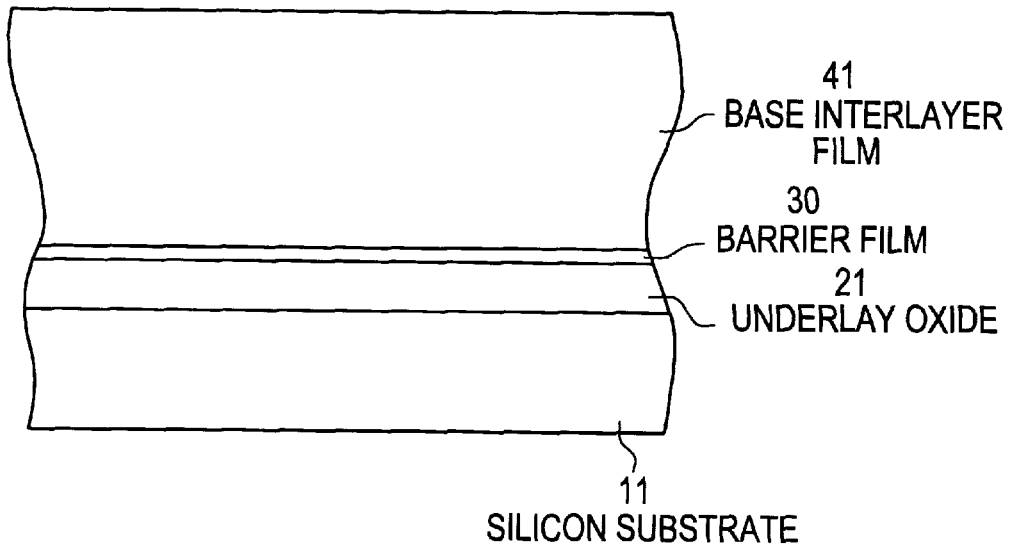
FIGS. 8(a) to 8(b) are sectional views of an embodiment of the present invention shown in the order of a manufacturing process, respectively.

In the present invention, as shown in FIG. 8(a), underlay oxide 21 is formed for stress relief on silicon substrate 11 which has a semiconductor element provided thereon. If underlay oxide 21 is used only for stress relief, the thickness can be in the range of 100 to 500 Å as in the prior example, however, underlay oxide 21 of the present invention must be made to the film thickness which satisfies the relational formula of the present invention and prevents a slow trapping which may be generated due to the moisture contained in the underlay oxide itself. The thickness of underlay oxide 21 which satisfies these conditions is 1,000 to 15,000 Å, and on which barrier film 30 which prevents penetration of the moisture from the outside is made with such as nitride film of about 50 to 500 Å in thickness. Further, there is a method in which, instead of forming the nitride film, the underlay oxide is first formed, and then nitrogen ion implantation is performed to nitrify the oxide surface for making it a barrier film.

After barrier film 30 is formed, base interlayer film 41 is formed with the thickness in the range of 8,000 to 15,000 Å to flatten the base, but when underlay oxide 21 is formed thick, base interlayer film 41 may be omitted according to cases.

Figure 8B:
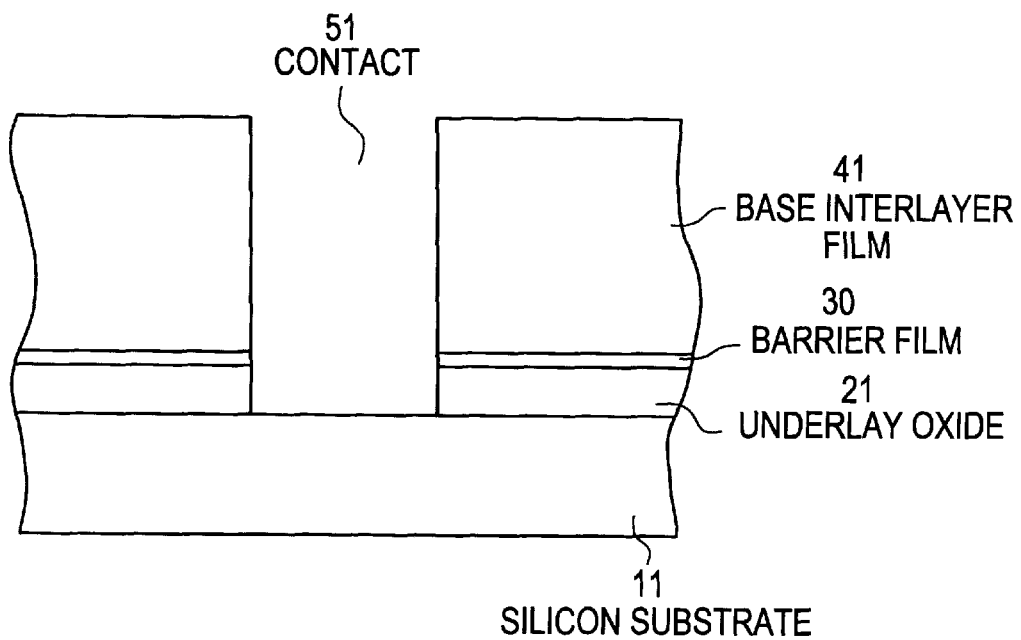
Figure 9A:
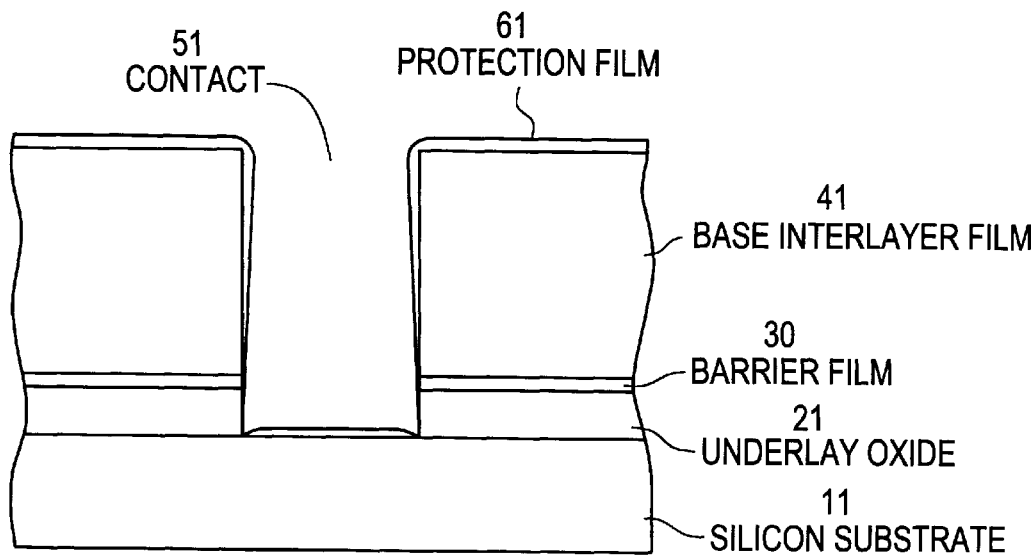
FIGS. 9(a) to 9(b) are sectional views of the embodiment of the present invention shown in the order of the manufacturing process, respectively.

Then as shown in FIG. 8(b), opening contact 51 is formed, and as shown in FIG. 9(a), protection film 61 of silicon substrate 11 is formed. Thereafter, for preparing ohmic junction of the contact, an N type dopant and a P type dopant both of high density are injected to the contact on an N type diffusion layer and to the contact on a P type diffusion layer, respectively. Then, such as a plasma CVD oxide of 200 to 500 Å thick is formed as protection film 61.

Figure 9B:
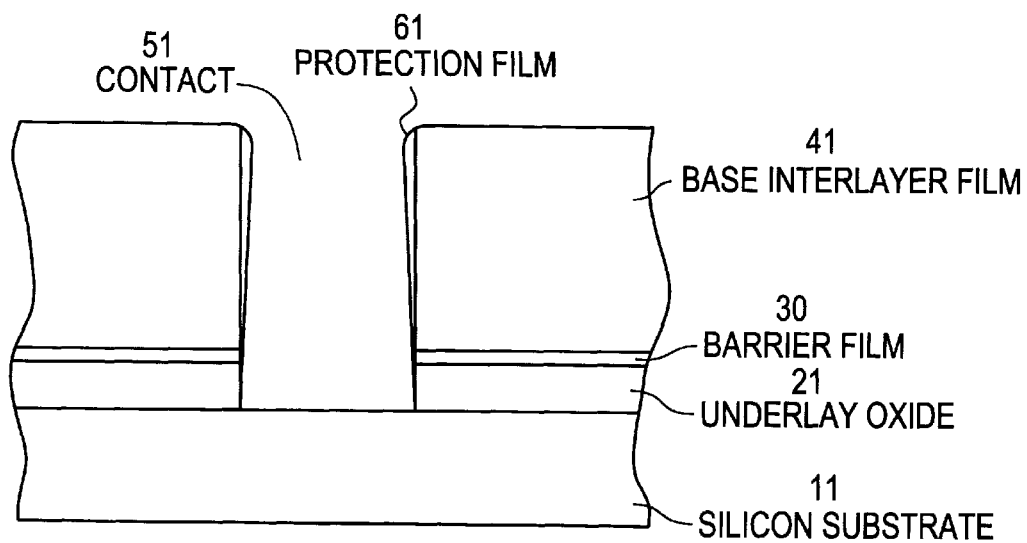

Subsequently, as shown in FIG. 9(b), protection film 61 is removed by anisotropic etching.

Figure 10A:
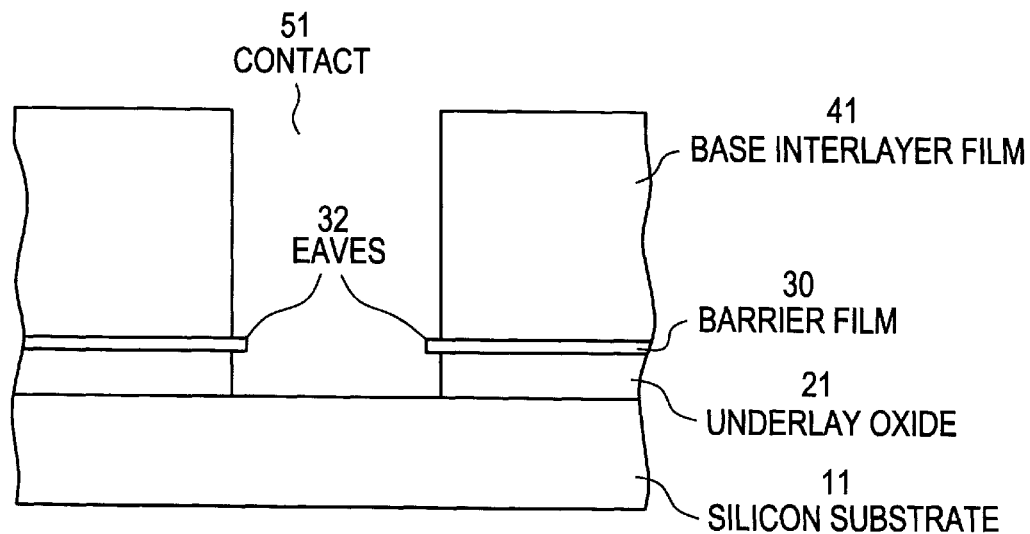
FIG. 10(a) is a sectional view of the embodiment of the present invention shown in the order of the manufacturing process.

Next, in order to remove a natural oxide on the silicon and to lower the contact resistance, oxide wet etching is performed to obtain a state shown in FIG. 10(a). Since barrier film 30 is not etched at this time, barrier film eaves 32 is formed inside contact 51.

Figure 10B:
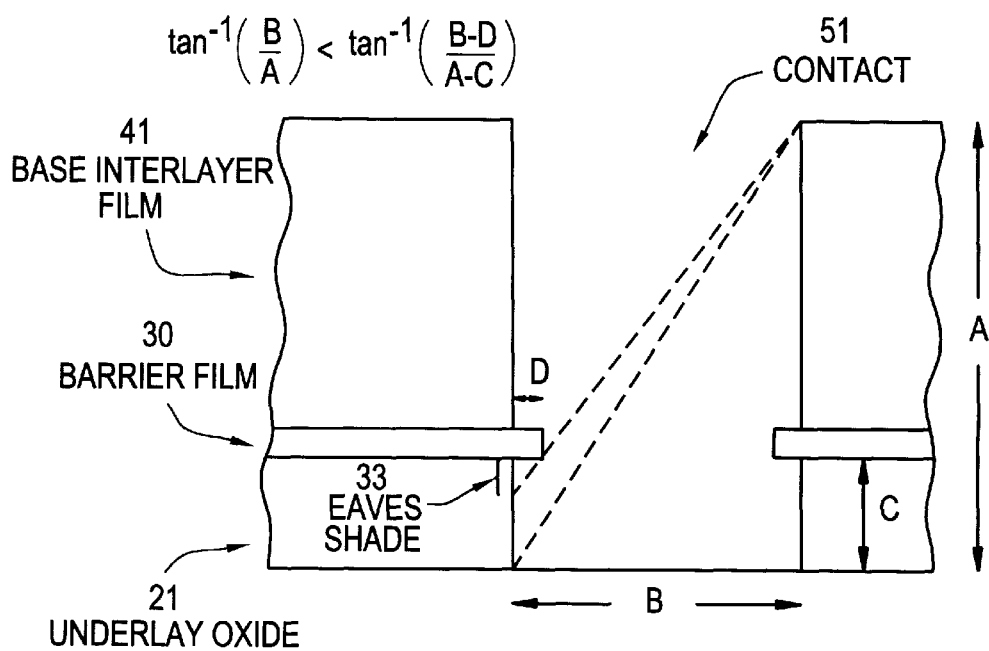
FIG. 10(b) is a typical view showing a structural characteristic of the present invention.

FIG. 10(b) is a typical view showing an inside state of the contact. That is, when the contact depth is assumed A, the contact diameter B, the underlay oxide thickness C, and the barrier film eaves protrusion length D, then the underlay oxide thickness C and the contact depth A are decided so as to satisfy the following inequality.

$$\tan^{-1}(B/A) < \tan^{-1}((B-D)/(A-C))$$

(since the contact diameter is decided by design and the barrier film eaves protrusion length is decided by an amount of wet etching of the oxide, the degree of freedom for the change to be performed on the manufacturing process is limited to small).

When the above relational inequality is valid, barrier film eaves shade 33 is produced only on the contact side wall, and hence silicon substrate 11 is not left in the exposed condition through the barrier metal sputtering later performed.

Figure 11:
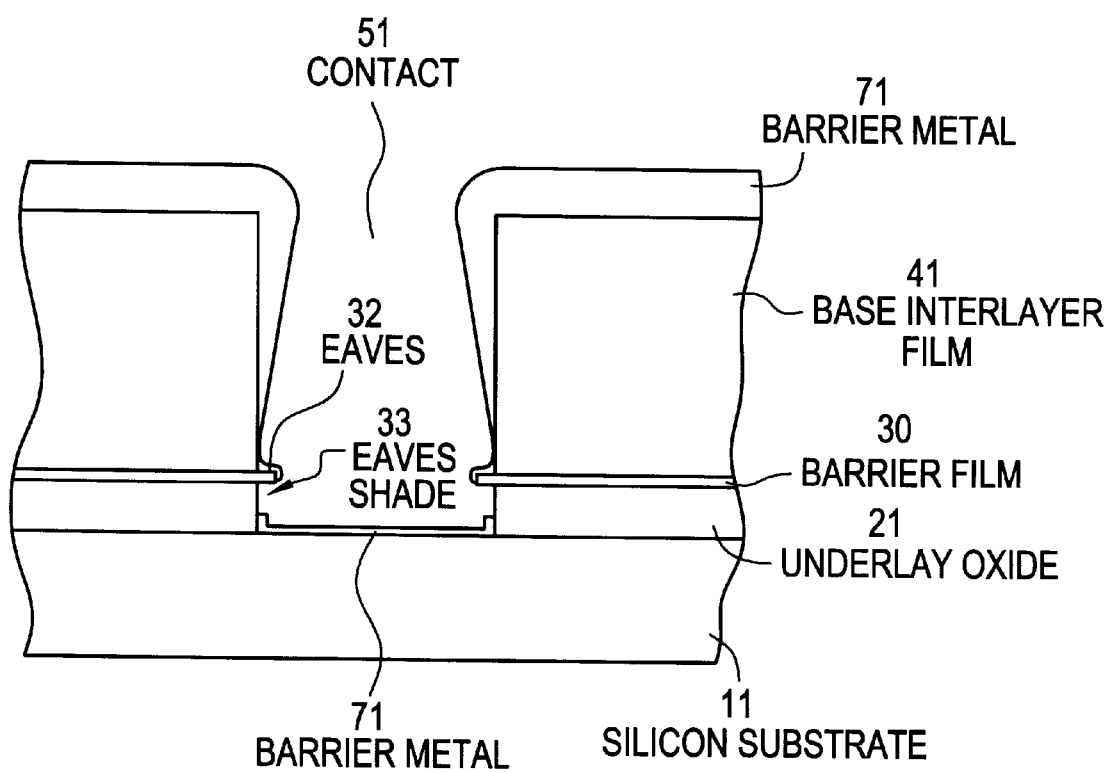
FIG. 11 is a sectional view of the embodiment of the present invention shown in the order of the manufacturing process.

Next, as shown in FIG. 11, barrier metal 71 is formed by spattering for preventing the reaction between the wiring metal or the contact filling metal and the silicon substrate. As barrier metal, Ti film or TiN film or a compound thereof is formed to the thickness of 500 to 3,000 Å. At this time, although no barrier metal is formed by sputtering on the aforementioned barrier film eaves shade 33 portion, silicon substrate 11 is not exposed thereby.

Next, the motion of an embodiment of the present invention will be described with reference to FIG. 10(b).

FIG. 10(b) shows a typical inside state view of the contact of the present invention.

As described in the explanation of the structure, a semiconductor device of the present invention has the following relation when the contact depth is A, the contact diameter B, the underlay oxide thickness C, and the barrier film eaves protrusion length D, $$\tan^{-1}(B/A) < \tan^{-1}((B-D)/(A-C))$$

Therefore, nitride film eaves shade 33 is produced only on the contact side wall, and hence silicon substrate 11 is not left as it is exposed at the time of barrier metal sputtering later performed.

Next, an embodiment of the present invention will be described with reference to the drawings.

In the present invention, as shown in FIG. 8(a), underlay oxide 21 of about 1,500 Å thick is formed for stress relief on silicon substrate 11 provided with a semiconductor element, and on underlay oxide 21, nitride film 30 of about 200 Å thick is formed as a barrier film for checking penetration of moisture from the outside.

After then, base interlayer film 41 for flattening the base is formed with a BPSG film to the thickness of about 10,000 Å.

Then as shown in FIG. 8(b), opening contact 51 of about 0.6 μm in diameter is formed, and as shown in FIG. 9(a), protection film 61 of silicon substrate 11 is formed. Thereafter, for setting up ohmic junction of the contact, an N type dopant and a P type dopant both of high density are injected to the contact on an N type diffusion layer and to the contact on a P type diffusion layer, respectively. Then, such as a plasma CVD oxide of 250 Å thick is formed as protection film 61.

Subsequently, as shown in FIG. 9(b), protection film 61 is removed by anisotropic etching.

Next, in order to remove a natural oxide on the silicon and to lower the contact resistance, wet etching by 130 BHF×30 seconds is applied on the oxide to obtain a state shown in FIG. 10(a). Since the nitride film is not etched at this time, nitride film eaves 32 is formed inside contact 51 with the eaves protrusion length of about 300 Å which is expected from the above etching time.

FIG. 10(b) is a typical inside state view of the contact at this time. Now in the present embodiment, the contact depth A=11,700 Å, the contact diameter B=6,000 Å, the underlay oxide thickness C=1,500 Å and the barrier film eaves protrusion length D=300 Å, then $$\tan^{-1}(B/A) = 0.4739,$$

$$\tan^{-1}((B-D)/(A-C)) = 0.5096$$

Therefore, it satisfies the following inequality.

$$\tan^{-1}(B/A) < \tan^{-1}((B-D)/(A-C))$$

Also in this case, barrier film eaves shade 33 is produced only on the contact side wall, and hence silicon substrate 11 is not left as it is exposed at the time of barrier metal spattering later performed.

Next, as shown in FIG. 11, barrier metal 71 is formed by spattering for preventing the reaction between the wiring metal or the contact filling metal and the silicon substrate. As barrier metal, Ti film of about 500 Å and an overlaying TiN film of about 1,500 Å are formed.

Next, the motion of the embodiment of the present invention will be described with reference to FIG. 10(b).

FIG. 10(b) shows a typical inside state view of the contact of the present invention.

Now in the above embodiment, the contact depth A=11,700 Å, the contact diameter B=6,000 Å, the underlay oxide thickness C=1,500 Å and the barrier film eaves protrusion length D=300 Å, then $$\tan^{-1}(B/A) = 0.4739,$$

$$\tan^{-1}((B-D)/(A-C)) = 0.5096$$

Therefore, it satisfies the following inequality.

$$\tan^{-1}(B/A) < \tan^{-1}((B-D)/(A-C))$$

Therefore, barrier film eaves shade 33 is produced only on the contact side wall, and hence silicon substrate 11 is not left as it is exposed when barrier metal sputtering is performed later.

As described above, with the contact depth A, the contact diameter B, the underlay oxide thickness C, and the barrier film eaves protrusion length D, the present invention satisfies the next inequality, $$\tan^{-1}(B/A) < \tan^{-1}((B-D)/(A-C))$$

Since a barrier film eaves shade is not projected on the silicon substrate of the contact bottom, the silicon substrate of the contact bottom is not left in the exposed state which may be caused by the shade of the barrier film eaves when the barrier metal is spattered, thereby advantageously preventing deterioration of the reliability.

What is claimed is:

1. A semiconductor device, comprising: a silicon semiconductor substrate, an underlay oxide, and a barrier film for checking penetration of moisture from an outside; wherein, by assuming a symbol A for a contact depth, B for a diameter of said contact, C for a thickness of said underlay oxide to be formed between said barrier film and said silicon semiconductor substrate, and D for an eave protrusion length of said barrier film, eaves being formed inside said contact when oxide wet etching is performed for removing natural oxide on the silicon semiconductor substrate and for reducing a contact resistance, a following relation is established, $$\tan^{-1}(B/A) < \tan^{-1}((B-D)/(A-C)).$$

2. A semiconductor device according to claim 1, wherein said barrier film for checking penetration of the moisture from the outside is composed of a nitride film.

3. A semiconductor device according to claim 1, wherein said barrier film for checking penetration of the moisture from the outside is composed of a film formed by performing nitrogen ion implanting on a surface of said underlay oxide.

* * * * *